United States Patent [19]
Papadas et al.

[11] Patent Number: 5,687,113
[45] Date of Patent: Nov. 11, 1997

[54] ELECTRICALLY PROGRAMMABLE MEMORY CELL

[75] Inventors: Constantin Papadas, Grenoble; Bernard Guillaumot, Le Fontanil, both of France

[73] Assignee: SGS-Thomson Microelectronics S.A., Saint Genis, France

[21] Appl. No.: 413,206

[22] Filed: Mar. 28, 1995

[30] Foreign Application Priority Data

Mar. 30, 1994 [FR] France ................. 94 04146

[51] Int. Cl.$^6$ ............................. G11C 13/00
[52] U.S. Cl. ................. 365/185.01; 365/189.01
[58] Field of Search ................. 365/185, 189.01, 365/230.01, 189.02, 189.03, 189.04, 185.01, 185.05, 185.18

[56] References Cited

U.S. PATENT DOCUMENTS

| | | | |
|---|---|---|---|
| 4,203,158 | 5/1980 | Bentchkowsky et al. | 365/185 |
| 4,590,665 | 5/1986 | Owens et al. | 365/185 |
| 4,754,320 | 6/1988 | Mizutani et al. | 357/23.5 |
| 4,804,637 | 2/1989 | Smayling et al. | 437/52 |
| 4,939,558 | 7/1990 | Smayling et al. | 357/23.5 |
| 5,202,576 | 4/1993 | Liu et al. | 257/315 |
| 5,267,194 | 11/1993 | Jang | 365/185 |

FOREIGN PATENT DOCUMENTS

| | | | |
|---|---|---|---|
| 0597722 | 5/1994 | European Pat. Off. | G11C 16/06 |
| 3345173 | 7/1985 | Germany | G11C 11/40 |

OTHER PUBLICATIONS

Patent Abstracts of Japan vol. 14, No. 22 (E-874) Jan. 17, 1990 & JP-A-01262669 (Sony Corp.).

Patent Abstracts of Japan vol. 11, No. 227 (E-526) Jul. 23, 1987 & JP-A-62043179 (Seiko Epson Corp.).

IEEE Electron Device Letters, vol. 11, No. 11, Nov. 1190, New York, USA, pp. 514–516, Sameer Haddad et al. "An Investigation of Erase-Mode Dependent Hole Trapping In Flash EEPROM Memory Cell".

Patent Abstracts of Japan, vol. 13, No. 2 (E-700) Jan. 6, 1989 & JP-A-63215079 (OKI Electric Ind Co. Ltd.).

Primary Examiner—Terrell W. Fears
Attorney, Agent, or Firm—Wolf, Greenfield & Sacks, P.C.; James H. Morris

[57] ABSTRACT

An electrically programmable cell comprises a substrate of the first conductivity type having a channel region, a control gate on a first insulating layer above the channel region, a source region and a drain region of a second conductivity type, on both sides of the channel region, at least the drain region including a low-doped region adjacent to the channel, a floating gate on a second insulating layer above at least a portion of said low-doped region. The thickness of the second insulating layer is lower than the thickness of the first insulating layer and is low enough for having charge transfers through tunnel effect.

17 Claims, 2 Drawing Sheets

ELECTRICALLY PROGRAMMABLE MEMORY CELL

BACKGROUND OF THE INVENTION

1. Field of the Invention

The present invention relates to memories for integrated circuits and more particularly to Electrically Programmable Read-Only (EPROM) and Electrically Erasable (EEPROM) memory cells.

2. Discussion of the Related Art

FIGS. 1A–1D are schematic cross-sectional views of various known types of memory cells.

FIG. 1A represents an EPROM cell that corresponds to a MOS transistor in which a floating gate is interposed between the control gate and the substrate. The EPROM cell includes, in a P-type substrate 1, source and drain N-type regions 2 and 3 having, for example, the so-called LDD shape as represented, that is, lower doped N-type regions are provided on both sides of the channel region. The channel region is coated with a first insulated floating gate GF, in turn coated with a second insulated control gate GC. Conventionally, the source and the substrate are grounded.

To program such a cell, the control gate and the drain are raised to positive voltages, for example, 12 volts and 6 volts, respectively. As a result, a depleted channel region is formed beneath the gate and electrons flow from the source to the drain. A voltage barrier occurs near the drain region and the electron flow in this region generates so-called hot electrons which are injected in the floating gate which is therefore negatively charged.

Thereafter, when an attempt is made to turn on the MOS transistor whose gate is the control gate GC, depending on whether the floating gate GF has been negatively charged or not, a more or less high gate voltage must be applied. The state of a cell can be determined during a read operation by applying a gate voltage such that the non-programmed cells turn conductive and the programmed cells remain blocked. In other words, the "threshold voltage" of the transistor is modified by the above mentioned operation.

The above cell described with relation to FIG. 1A is normally erased by exposure to UV-rays. Then, the electrons gain a sufficient energy to overcome the oxide barrier and thus the electrons stored in this floating gate are eliminated.

Various alternatives of such EPROM cells have been devised. Some of these alternatives are illustrated in FIGS. 1B–1D.

FIG. 1B differs from FIG. 1A by the doping level of the source region. This doping is progressive so that the source-substrate junction can withstand a relatively high voltage. This cell is electrically erasable by applying a high voltage to the source whereas the control gate is grounded and the drain is floating.

A drawback of the erasing mode lies in that, if the erasing time duration is too long, an electron depletion may occur in the floating gate which is then positively charged instead of returning to a neutral state. The channel may then be permanently conductive and, during a reading step, it is no longer possible to identify a conductive cell. Various circuits have been devised to avoid this drawback.

FIG. 1C illustrates a structure to avoid the above-mentioned drawback. The floating gate GF coats only a portion of the channel length so that, even if the floating gate GF remains slightly positively charged, there is still a blocked channel region. However, this structure requires an increased cell surface.

FIG. 1D represents a further alternative described in an article by Mizutani and Makita in IEEE Transactions on Electron Devices, Vol. ED-34, No. 6, June 1987, pp 1297–1303 and in Japanese application 62/215 079. In this structure, the floating gate coats only a portion of the channel region and is not coated with the control gate. The above article describes an implementation of this floating gate using a polysilicon spacer formed on one side of the control gate.

The above described FIGS. 1A–1D are very schematic and the existing devices exhibit many alternatives with respect to what has been described, especially regarding the shape of the source and drain regions, of the LDD type or not, of the doping gradient type (as represented in FIG. 1B) or not, and the connections. More particularly, in FIGS. 1A–1D, a source metallization and a drain metallization are represented over each source and drain region. Conventionally in a memory array, the various memory cells have a common source. Then, no metallization source is provided on each cell.

EPROM cells, wherein the floating gate extends not only above the channel but also above a low doped extension of the source and/or drain adjacent to the channel, are also known in the art (cf. Japanese application 1/262 669; U.S. Pat. Nos. 4,804,637, 4,203,158, 5,267,194, 5,202,576; European application 5,977,722; German application 3 345 173; and IEEE Electron Device Letters (Vol. 11, No. 11, Nov. 1990, pp. 514–516). In most of these documents, the floating gate and the control gate are at least partially stacked.

FIG. 9 of U.S. Pat. No. 4,754,320 shows an EPROM cell wherein the floating gate is lateral with respect to the control gate and extends above a low doped extension of the device. The thicknesses of the insulating material under the control gate and the floating gate are equal and the charging of the floating gate results from hot carrier injection.

Considering the operation of the above-described memory cells, in all these cells, hot carriers generated in the channel will have an effect in at least one of the operating modes. All these cells exhibit at least two of the following drawbacks.

1. At each read operation, hot carriers are unavoidably generated in the channel, near the drain, and a spurious injection of carriers (electrons) occurs in the gate. As a result, a charge accumulation in the floating gates occurs and the non-programmed cells look, after several read operations, like programmed cells. In other words, the threshold voltages of the programmed cells and non-programmed cells get closer and become more difficult to differentiate.

2. The programming operation requires the flow of a relatively high current between the source and the drain with, for example, a 12-volt voltage. In conventional integrated circuits, means are known for providing from a low supply voltage (for example 3 or 5 volts) a higher voltage (approximately 12 volts). These systems are called charge pumps. However, a drawback of charge pumps is that they have high output impedances and therefore are not adapted to conduct high currents. Therefore, a high voltage supply external to the integrated circuit must be provided for the programming step.

3. The programming and erase operations are binary operations. These cells are not adapted to store analog values.

Other drawbacks are particularly related to EEPROM cells, that is, cells having a source region with a specific diffusion profile such as illustrated in FIG. 1B. These drawbacks are described as follows.

4. Given the type of formation of the source regions, and, as the case may be, the drain regions, the diffusion depth of the doping atoms of the source beneath the gate is not properly controlled; therefore, the effective length of the channel region is variable, which affects the threshold voltage.

5. The injection of hot carriers in the gate during the erase operation at high voltages can degrade the gate oxide. These cells therefore are fragile.

6. As above mentioned, there is a risk that the polarity of the floating gates may be inverted, which requires providing necessary steps so that the cells are not permanently conductive.

SUMMARY OF THE INVENTION

An object of the present invention is to provide a memory cell that avoids all the above-mentioned drawbacks of conventional cells including electrically erasable cells.

Another object of the present invention is to provide such a cell whose surface is not larger than the surface of a conventional memory cell.

A further object of the present invention is to provide such a cell whose fabrication is not more complex than that of a conventional cell.

To achieve these objects, the present invention provides a new type of floating gate memory cell, in which the memorization phenomenon no longer depends upon modulation of the threshold voltage of a MOS transistor but depends on the modulation of the drain resistance of the MOS transistor, and in which the floating gate is charged and discharged through tunnel effect and is not influenced by hot carriers generated in the channel region.

More particularly, the present invention provides an electrically programmable cell including, over a channel region of a first conductivity type, a control gate and, on both sides of the channel region, a source region and a drain region of a second conductivity type, at least the drain region including a low doped region near the channel. An insulated floating gate covers at least partially this low doped region.

This insulated floating gate can also cover an extension of the source region or can entirely surround the control gate.

According to an embodiment of the invention, the insulation layer beneath the floating gate is made of silicon oxide having a thickness ranging from 8 nm to 12 nm, for example, approximately 10 nm.

According to an embodiment of the invention, the insulation layer of the control gate is made of silicon oxide substantially twice thicker than the floating gate oxide.

A process for programming a memory cell according to the invention provides connecting the drain, the source and the substrate to ground and applying a voltage pulse to the control gate, this pulse being positive if the substrate is of the P-type.

A process for erasing a memory cell according to the invention provides connecting the drain, the source and the substrate with ground and applying a voltage pulse to the control gate, the pulse being negative if the substrate is of the P-type.

An alternative process for erasing a memory cell according to the invention provides connecting the control gate and the substrate to ground and applying a voltage pulse to the drain and the source, the pulse being positive if the substrate is of the P-type.

A process for manufacturing an EPROM cell according to the invention includes the steps of delineating an active region on a conductive substrate, coating this active region with a gate oxide and delineating a gate region substantially in the middle of the active region, removing the gate oxide except beneath the gate region, forming a thin oxide layer on the substrate, over and around the gate, implanting a dopant of a second conductivity type with a low doping level, forming spacers made of a conductive material on both sides of the gate, and implanting a source and drain dopant of the second conductivity type with a high doping level.

According to an embodiment of the invention, the process furthermore includes the step of eliminating a spacer on the source side.

The foregoing and other objects, features, aspects and advantages of the invention will become apparent from the following detailed description of the present invention when taken in conjunction with the accompanying drawings.

DETAILED DESCRIPTION

Figure 1A:
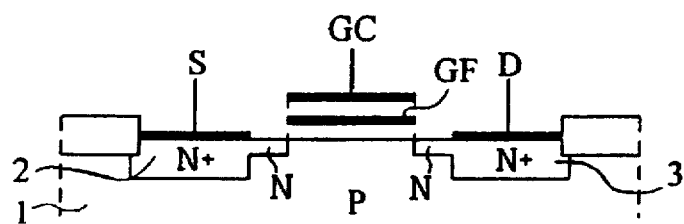
FIGS. 1A–1D schematically illustrate various types of EPROM and EEPROM cells according to the prior art.
Figure 1B:
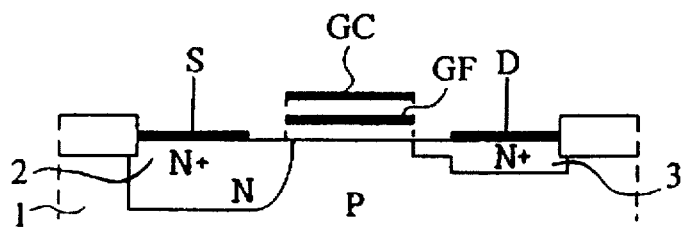
Figure 1C:
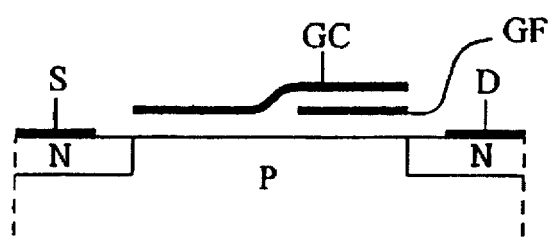
Figure 1D:
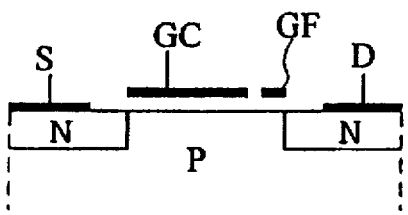
Figure 2:
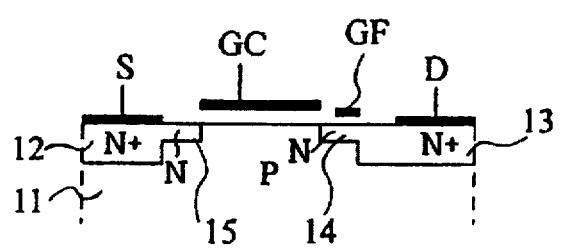
FIG. 2 schematically represents a memory cell according to the invention.

As represented in FIG. 2, a memory cell according to the invention has a structure similar to the structure of an LDD type MOS transistor, that is, a MOS transistor formed from a semiconductor substrate 11 having a first conductivity type, for example P, provided with a source region 12 and a drain region 13 and with an insulated control gate GC. At least the drain region includes a portion 14, near the MOS transistor channel region, having a lower doping level. At least a part of the lower doped drain region 14 is covered with a floating gate GF and the insulating material of this floating gate is substantially twice thinner than the control gate insulating material.

As represented in FIG. 2, the source region 12 also includes a lower doped portion 15 near the channel region. As explained below, this portion is not needed for the operation of the device according to the invention and is merely the result of a preferred fabrication process. Similarly, FIG. 2 represents source and drain metallizations but, as indicated above, generally, no source metallization is provided for each cell of a memory array.

According to the invention, the floating gate is formed only over a portion of the drain region and does not extend over a portion of the channel region.

As a result, there is a fundamental difference of operation between the memory cell according to the invention and the prior art cells. First, it should be understood that the charge or absence of charge of the floating gate will, in this case, act on the drain resistance and no longer on the threshold voltage of the MOS transistor associated with the control gate. Furthermore, the physical effects inherent in the writing process (programming according to the invention are basically different from the prior art.

In the prior art, as above described, the programming, that is, the injection of electrons into the floating gate results from the generation of hot carriers in the channel portion near the drain. Here, the injection of electrons into the floating gate results from a tunnel (Fowler-Nordheim) effect. More particularly, for the programming of a cell according to the invention, the drain, the source and the substrate are grounded and a voltage pulse is applied to the control gate GC, for example, at approximately 10–12 volts. The excess electrons generated in the substrate beneath the control gate flow through the drain extension area 14 and through the tunnel oxide layer towards the floating gate. It will be noted that this process does not require any current flow.

Of course, the thickness of the insulation layer (generally silicon oxide) beneath the floating gate must be sufficiently low so that the transfer of electrons from the substrate to the gate due to the tunnel effect can occur. In practice, this leads to using oxide thicknesses ranging from 8 nm to 12 nm, typically 10 nm. Such very small thicknesses can be implemented without any drawback in the cell according to the invention since this tunnel oxide is not subject to hot carrier bombardments.

Symmetrically, the erasing operation is performed by maintaining the drain, the source and the substrate to ground and by applying a negative pulse to the control gate, for example at a voltage ranging from approximately −8 to −12 volts. Alternatively, the substrate and the control gate can be grounded and a positive pulse can be applied to the source and the drain.

Reading is made by applying a voltage on the drain and a voltage on the control gate to render the channel conductive. Thus, for given voltages, the current flow depends upon the floating gate charge that determines the resistance of the drain or at least of the portion 14 of the drain region located beneath the floating gate.

In the above description, a memory cell with a floating gate located above an extension of the drain region is proposed. Those skilled in the art will note that this floating gate can also extend over an extension of the source region or, more generally, can entirely surround the control gate.

The surface area of the floating gate memory cell according to the invention is not greater than the surface area of a MOS transistor or than that of a conventional EPROM cell and palliates all the above mentioned drawbacks of the prior art.

1. During reading, if hot electrons are generated in the channel region near the drain region, these electrons are transferred towards the control gate and not towards the floating gate and therefore do not modify the charge state of the floating gate.

2. The programming and erasing of the floating gate require, as in the prior art, voltages higher than the usual operative voltages, that is, voltages ranging from 10 to 12 volts instead of operative voltages (reading) of 1.8 to 3.3 volts for example, but practically no current flow. Therefore, it is possible to use an integrated circuit including only one current supply source associated, inside the integrated circuit, with a charge pump which need not provide high currents.

3. The phenomena implied in programming and erasing of the floating gate are essentially proportional to the amplitude and time duration of the voltage pulse applied on the control gate. Thus, it is possible to perform selective programming, which causes a resistance variation selected within a determined range.

Thereby, the present invention can be used for storing analog values.

4. The accuracy of the electrical length beneath the channel is as good as in any conventional MOS transistor.

5. During erasing, no hot carriers are produced beneath the floating gate. So, there is no risk of degradation of the tunnel oxide (in addition, the oxide beneath the control gate is generally thicker and therefore does not risk being deteriorated).

6. The presence of a charge on the floating gate does not modify the channel conductivity and thus avoids the risk that a transistor be permanently conductive.

It will now be demonstrated that a further advantage of the memory cell according to the invention is that the cell is compatible with the conventional processes for fabricating MOS transistors and that the fabrication of this cell is not more complex, and can even be simpler, than the fabrication of cells with stacked gates.

An exemplary possible sequence of fabrication steps will be shortly described since those steps, separately considered, are relatively conventional, and constitute only one possible fabrication process of a structure according to the invention, and have been partially described in the above-mentioned article by Mizutani and Makita.

Figure 3A:
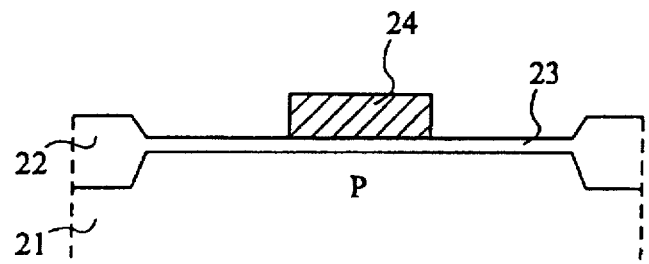
FIGS. 3A–3D illustrate an exemplary embodiment of a process for fabricating a memory cell according to the invention.

FIG. 3A represents a structure at an intermediate conventional step of fabrication of a MOS transistor. An active region is delineated by a thick oxide region 22 on a P-type substrate 21. This active region is coated with a thin oxide layer 23, which is generally formed by thermal oxidation, that will be used as control gate oxide. This gate oxide is coated with a gate region 24, generally formed by deposition and etching of an $N^+$-type polysilicon layer.

Figure 3B:
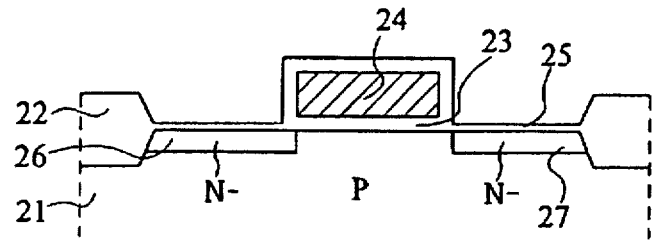

As represented in FIG. 3B, oxide 23 is then etched away, and the whole structure is re-oxidized by thermal oxidation until an oxide 25, having the desired thickness to form the tunnel oxide located beneath the floating gate, is obtained.

During one of the steps comprised between the steps illustrated in FIGS. 3A and 3B, an N-type dopant (usually phosphorous) is implanted to form low doped source and drain regions 26 and 27.

Figure 3C:
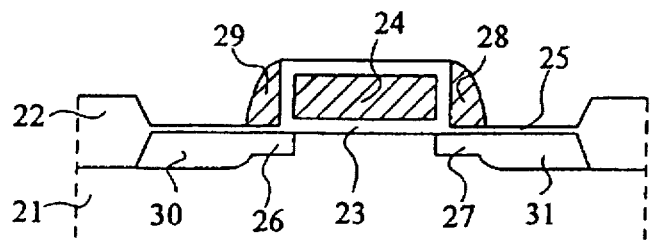

Then, as represented in FIG. 3C, spacers 28 and 29 are formed on both sides of the control gate 24 with any known process using conductive material, usually N+-type polysilicon. Spacers 28 and 29 are insulated from the control gate and from the substrate by the thin oxide layer 25. Once spacers 28 and 29 are formed, a second higher doped ion implantation is performed to form the source and drain regions 30 and 31, that are more highly doped than regions 26 and 27, as is conventional during the fabrication of LDD-type MOS transistors.

Figure 3D:
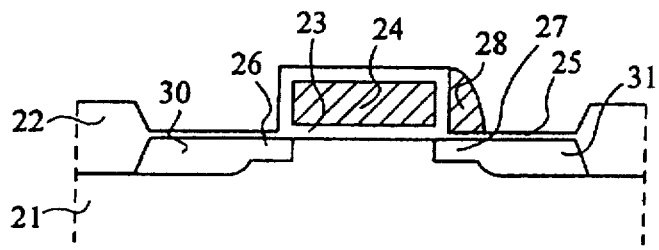

Last, as represented in FIG. 3D, if desired, the spacer 29 near the source side is removed by masking and selective etching of the conductive material forming this spacer (for example, polysilicon). Then, one performs the conventional steps of opening contacts over the drain region 31, forming metallization or silicide for these contacts, and the final operations for interconnection and insulation.

FIG. 3D represents a structure of a memory cell having the same functions as the cell in FIG. 2. Regions 30 and 26 correspond to the source region 12, region 31 corresponds to the drain region 13, region 27 corresponds to the drain region 14 extending beneath the floating gate, spacer 28 corresponds to the floating gate GF, and region 24 corresponds to the control gate GC.

The process illustrated in FIGS. 3A–3D is only an exemplary process usable to fabricate a device according to the present invention. Furthermore, this process can be modified to have various alternatives usually performed for the fabrication of MOS transistors.

Preferably, when the substrate has a doping level of approximately $5 \times 10^{16}$ to $5 \times 10^{17}$ atom/cm$^3$, the doping level of the low doped regions 26 and 27 is approximately $5 \times 10^{17}$ to $5 \times 10^{18}$ atom/cm$^3$, the thickness of the tunnel oxide 25 is approximately 8 nm to 12 nm (typically 10 nm), the thickness of oxide 23 beneath the control gate is typically 20 nm (approximately twice the thickness of the insulation layer beneath the floating gate).

Inventors have noticed by simulation that, with a cell of this type, for a determined voltage of the read gate, for example 3 volts, a ratio higher than 2 is obtained between the current in the programmed sells and the current in the non-programmed cells. This is better than for most of the conventional cells for which this ratio seldom exceeds 1.5.

Figure 4:
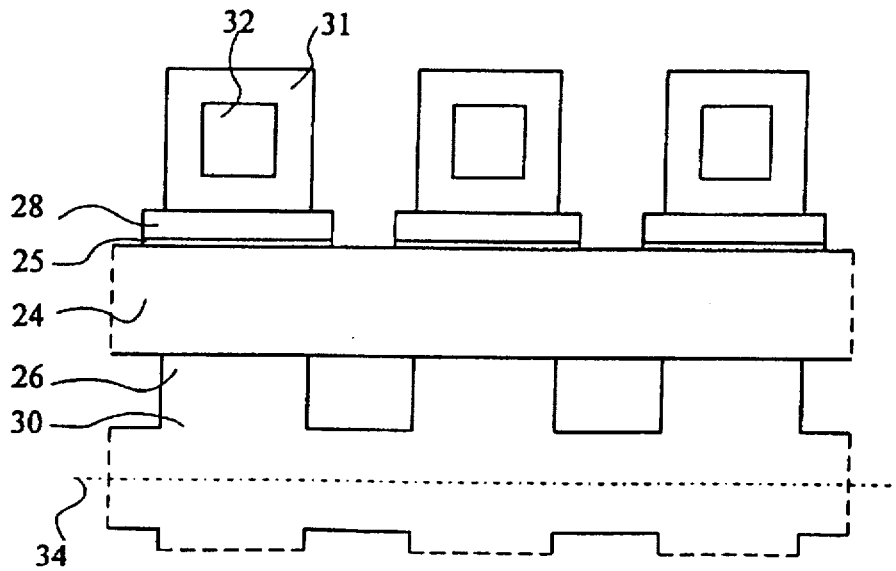
FIG. 4 is a top view of an exemplary embodiment of a memory cell array according to the invention.

FIG. 4 represents an exemplary top view of a portion of a memory cell array according to the present invention. In FIG. 4, regions corresponding to the regions of FIG. 3D are indicated with the same references. Thus, each memory cell has a drain 31 including a drain contact 32, a floating gate 28, a control gate 24 and a source 26–30. These memory cells are duplicated in the transverse direction of the figure and are symmetrically duplicated with respect to a horizontal axis 34. The control gate 24 is common to all the cells of the same row, and source 30 is common to all the cells of two adjacent rows positioned on both sides of the symmetry axis 34.

Again, many design variants of a memory cell array according to the present invention can be devised by those skilled in the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. Electrically programmable cell comprising:
   a substrate of a first conductivity type, having a channel region having a first side and a second side;
   a control gate located on a first insulating layer above the channel region;
   a drain region of a second conductivity type located on the substrate adjacent to the first side of the channel region, the drain region having a low-doped region adjacent to the channel region;
   a source region of the second conductivity type located on the substrate adjacent to the second side of the channel region;
   an insulated floating gate located on a second insulating layer above a portion of the drain region, the insulated floating gate being disposed such that it does not extend over the channel region.

2. The memory cell of claim 1, wherein the source region includes a low-doped region adjacent to the channel region, and wherein the insulated floating gate is located on the low-doped area of the drain region and the low-doped area of the source region.

3. The memory cell of claim 2, wherein the insulated floating gate encircles the control gate.

4. The memory cell of claim 3, wherein the second insulating layer has a thickness ranging from 8 nm to 12 nm.

5. The memory cell of claim 4, further comprising a second insulating layer disposed beneath the control gate, said second insulating layer made of silicon oxide having a thickness of approximately 20 nm.

6. The memory cell of claim 2, wherein the second insulating layer has a thickness ranging from 8 nm to 12 nm.

7. The memory cell of claim 6, further comprising a second insulating layer disposed beneath the control gate, said second insulating layer made of silicone oxide having a thickness of approximately 20 nm.

8. The memory cell of claim 2, further comprising a second insulating layer disposed beneath the control gate, said second insulating layer made of silicone oxide having a thickness of approximately 20 nm.

9. The memory cell of claim 1, wherein the second insulating layer has a thickness ranging from 8 nm to 12 nm.

10. The memory cell of claim 9, further comprising a second insulating layer disposed beneath the control gate, said second insulating layer made of silicon oxide having a thickness of approximately 20 nm.

11. The memory cell of claim 1, further comprising a second insulating layer disposed beneath the control gate, said second insulating layer made of silicon oxide having a thickness of approximately 20 nm.

12. An electrically programmable cell comprising:
   a substrate of a first conductivity type having a semiconductor face including a channel region, the channel region having first and second sides and an upper surface;
   a first insulating layer disposed over the channel region;
   a control gate disposed over the first insulating layer and disposed over the upper surface of the channel region of the semiconductor face;
   a drain region of a second conductivity type disposed over the semiconductor face adjacent the first side of the channel region;
   a source region of the second conductivity type disposed over the semiconductor face adjacent to the second side of the channel region;
   an insulated floating gate disposed over the semiconductor face such that the insulated floating gate encircles the control gate; and
   a second insulating layer disposed between the drain region and the insulated floating gate.

13. The electrically programmable cell of claim 12, wherein the drain region includes a low-doped region adjacent the first side of the channel region.

14. The electrically programmable cell of claim 13, wherein the source region includes a low-doped region adjacent to the second side of the channel region.

15. The electrically programmable cell of claim 14, wherein the insulated gate is disposed over only the low-doped region of the drain region and the low-doped region of the source region.

16. The electrically programmable cell of claim 12, a thickness of the first insulating layer is greater than a thickness of the second insulating layer.

17. The electrically programmable cell of claim 1, wherein the insulated floating gate is disposed over only the low doped region of the drain region.

\* \* \* \* \*